(12) United States Patent
Ko et al.

(10) Patent No.: US 7,771,579 B2
(45) Date of Patent: Aug. 10, 2010

(54) ELECTRO CHEMICAL PLATING ADDITIVES FOR IMPROVING STRESS AND LEVELING EFFECT

(75) Inventors: Ting-Chu Ko, Hsinchu (TW); Chien-Hsueh Shih, Taipei (TW); Minghsing Tsai, Chu-Pai (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 1510 days.

(21) Appl. No.: 11/004,294

(22) Filed: Dec. 3, 2004

(65) Prior Publication Data

US 2006/0118422 A1    Jun. 8, 2006

(51) Int. Cl.
*C25D 3/38* (2006.01)

(52) U.S. Cl. ............................ 205/297; 205/296

(58) Field of Classification Search .............. 205/80, 205/286, 297; 106/1.05, 1.25, 1.26
See application file for complete search history.

(56) References Cited

U.S. PATENT DOCUMENTS

| | | | |
|---|---|---|---|
| 6,495,453 B1 * | 12/2002 | Brongersma et al. | 438/660 |
| 6,740,221 B2 * | 5/2004 | Cheung et al. | 205/104 |
| 6,793,796 B2 * | 9/2004 | Reid et al. | 205/102 |
| 2002/0127847 A1 * | 9/2002 | Alling et al. | 438/630 |
| 2005/0199507 A1 | 9/2005 | Shih et al. | |

* cited by examiner

*Primary Examiner*—Edna Wong
(74) *Attorney, Agent, or Firm*—Duane Morris LLP (57) ABSTRACT

A chemical solution for an electro chemical plating process includes an electro chemical plating solution; and an additive, added in the electro chemical plating solution, substantially consisting of a polymer with one or more kinds of impurities, wherein each kind of the impurities has a density, with respect to the polymer, lower then $10^{19}$ atoms/cc.

18 Claims, 6 Drawing Sheets

402 — providing an electro chemical plating solution

404 — adding additives into the electro chemical plating solution

406 — performing the ECP process

ELECTRO CHEMICAL PLATING ADDITIVES FOR IMPROVING STRESS AND LEVELING EFFECT

BACKGROUND

The present invention relates generally to an electro chemical plating (ECP) process, and more particularly to an additive used in the same.

As semiconductor technology continues to advance, integrated circuit (IC) components, such as transistors and chip interconnect wirings, continue to shrink in size. These IC components become small enough, such that the processing speed is very sensitive to intrinsic resistance and capacitance of the interconnect wirings. As such, high conductive materials are the popular choices for the interconnect wirings. Many of these high conductive metals are quickly replacing aluminum which was once widely used for IC's interconnections. The speed of interconnect is affected by resistance and capacitance of the conductive materials used. Resistance and capacitance of the conductive materials, such as copper and aluminum, have a trade off relationship, such that chip makers can give up more resistance for lower capacitance, or vice versa. For example, copper with a lower resistivity may lead indirectly to a capacitance advantage. For identical line dimensions, copper and aluminum provide similar capacitance, but copper has a lower resistance. Similarly, for copper and aluminum of equivalent resistance, copper lines can be thinner and exhibit lower capacitance. Thus, copper is now one of the most popular materials for conducive lines in the IC technology.

However, when copper is used in the IC, issues such as oxidation occurs. Unlike aluminum whose initial oxidation layer helps form a protective layer preventing further oxidation, copper can oxidize indefinitely. This oxidation problem can lead the copper based interconnects into an unreliable state, causing many problems in the future. In order to keep this from happening, additives are added in the electro chemical plating solution in the ECP process. The additives can also provide several other functions, such as acceleration, suppression, and leveling. A popular choice of materials used for these additives is polymer, a chemical compound or mixture of compounds formed by polymerization and consisting essentially of repeating structural units. Most of the conventional polymer additives have a relatively high impurity density. This raises the stress applied onto the copper based interconnects and may lead to disturbance of the leveling effect. The higher stress created by the additives of high impurity density increases the chances of cracking of the copper based interconnects, thereby causing other integration problems.

What is needed is an additive used in the ECP process for producing the copper based structures with improved stress and leveling effects.

SUMMARY

In view of the foregoing, this invention provides a chemical solution used in the ECP process for achieving a copper based structure with improved characteristics. In one embodiment, the chemical solution includes an electro chemical plating solution, and an additive added in the electro chemical plating solution. The additive essentially consists of a polymer with one or more kinds of impurities, wherein each kind of the impurities has a density, with respect to the polymer, lower then $10^{19}$ atoms/cc.

The construction and method of operation of the invention, however, together with additional objects and advantages thereof will be best understood from the following descriptions of specific embodiments when read in connection with the accompanying figures.

DESCRIPTION

This invention provides an additive to be added in a chemical solution to be used in the ECP process for forming a copper based structure. The additive is composed of polymer with low impurity and medium charge densities. The low impurity density allows the copper based structure to be formed with less internal stress. The medium charge density provides the copper based structure with satisfying gap-filling ability and leveling power. Such additive improves the physical characteristics of the copper based structure formed in the ECP process.

Figure 1:
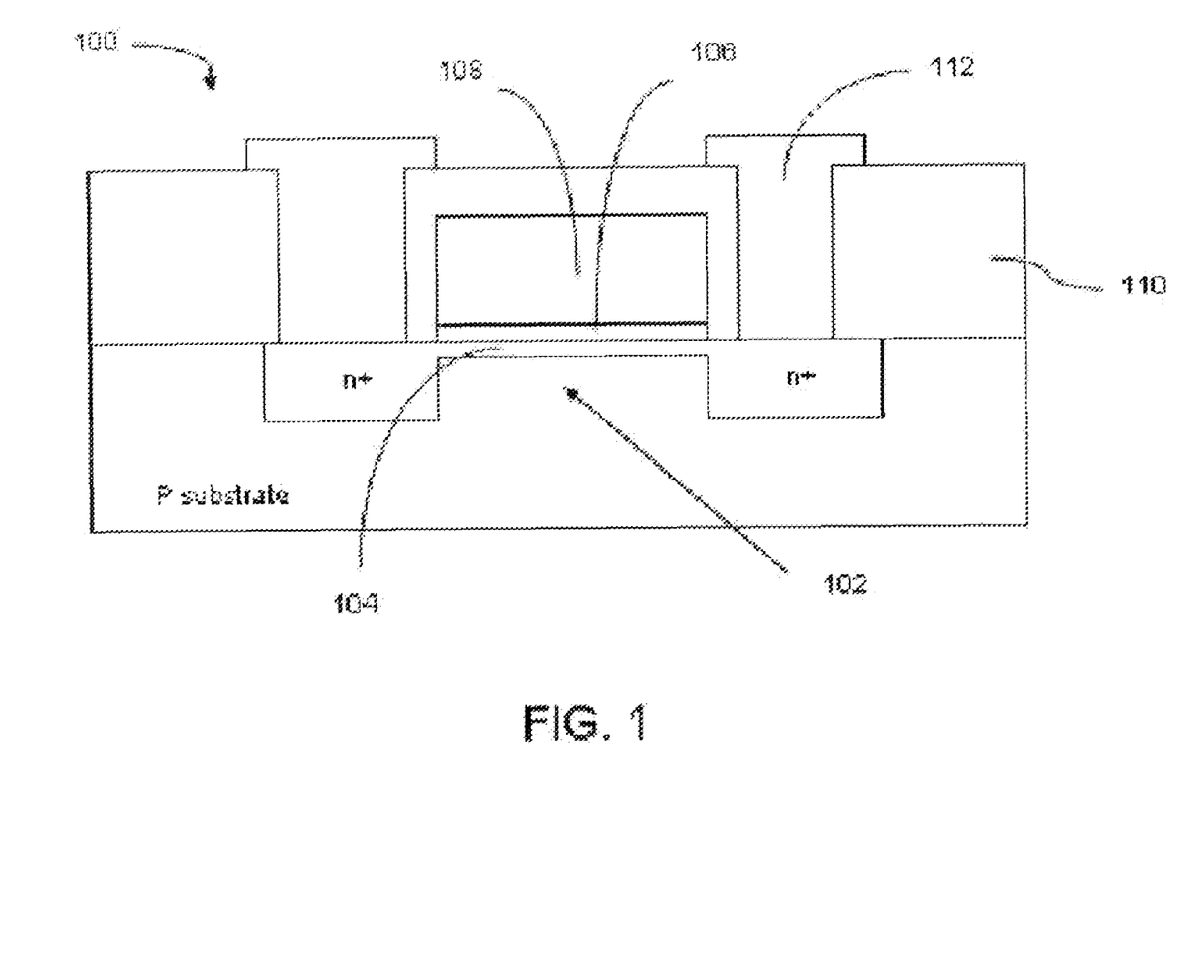
FIG. 1 illustrates a cross-sectional view of a metal-oxide-semiconductor field-effect transistor (MOSFET).

FIG. 1 illustrates a physical construction of a N-type MOSFET 100. The MOSFET is constructed on a P substrate with n+ doped areas as the source and drain on either side of the substrate. The distance 102 between the n+ doped areas is often known as the channel length. The source and drain are identical and can be interchanged, depending on the application of voltages. For example, the electron current flow will be generated from the area connected to Vss (source), and travel through the conducting channel 104 as determined by the gate voltage (Vgs) to the area connected to Vdd (drain). If the gate voltage is smaller than a threshold value, no electron current will flow from the source to the drain. The gate terminal is composed of a gate electrode 108, which is separated from the conducting channel 104 by a gate dielectric layer 106. A dielectric layer 110 is formed over the gate electrode 108, the source and the drain. A interconnection 112, such as a copper plug, is formed in the dielectric layer, and in contact with the source and drain. The physical and electrical characteristics of the interconnection 112 is improved by forming the same in the ECP process using a chemical solution added with the proposed addictives, as will be illustrated below.

Figure 2A:
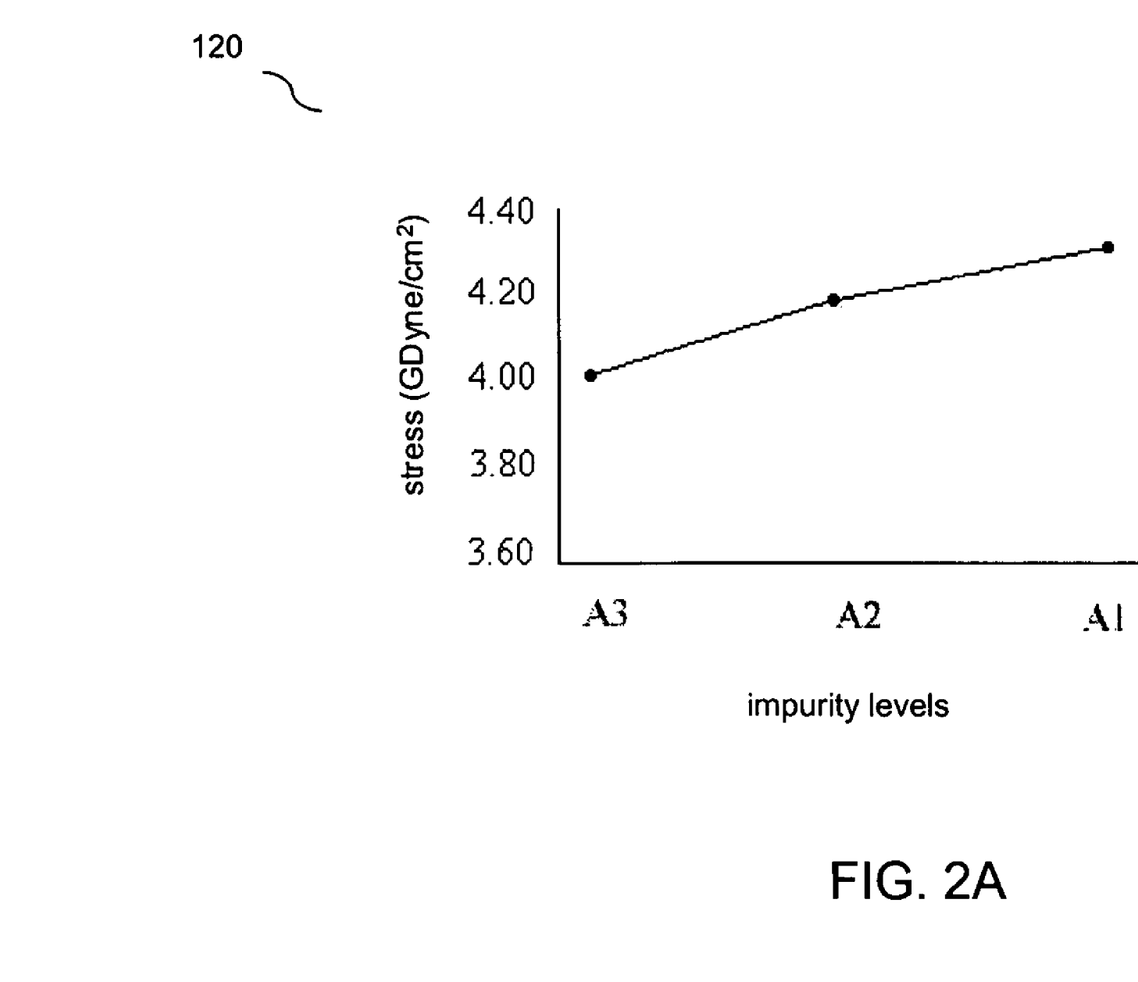
FIGS. 2A-2C illustrate three graphs showing experimental results for copper based structures formed in the ECP process using additives of various impurity densities, in accordance with one embodiment of the present invention.
Figure 2B:
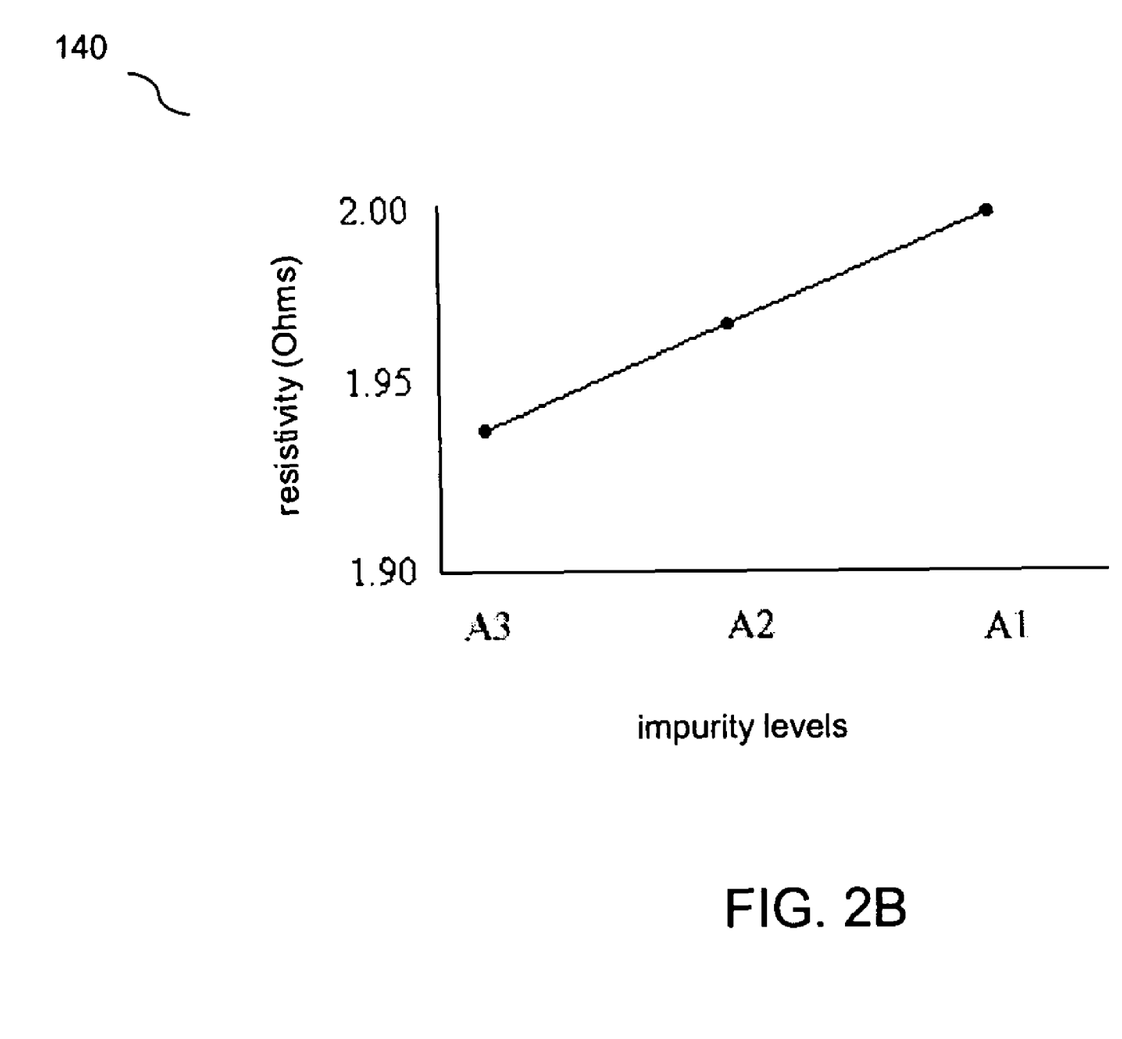
Figure 2C:
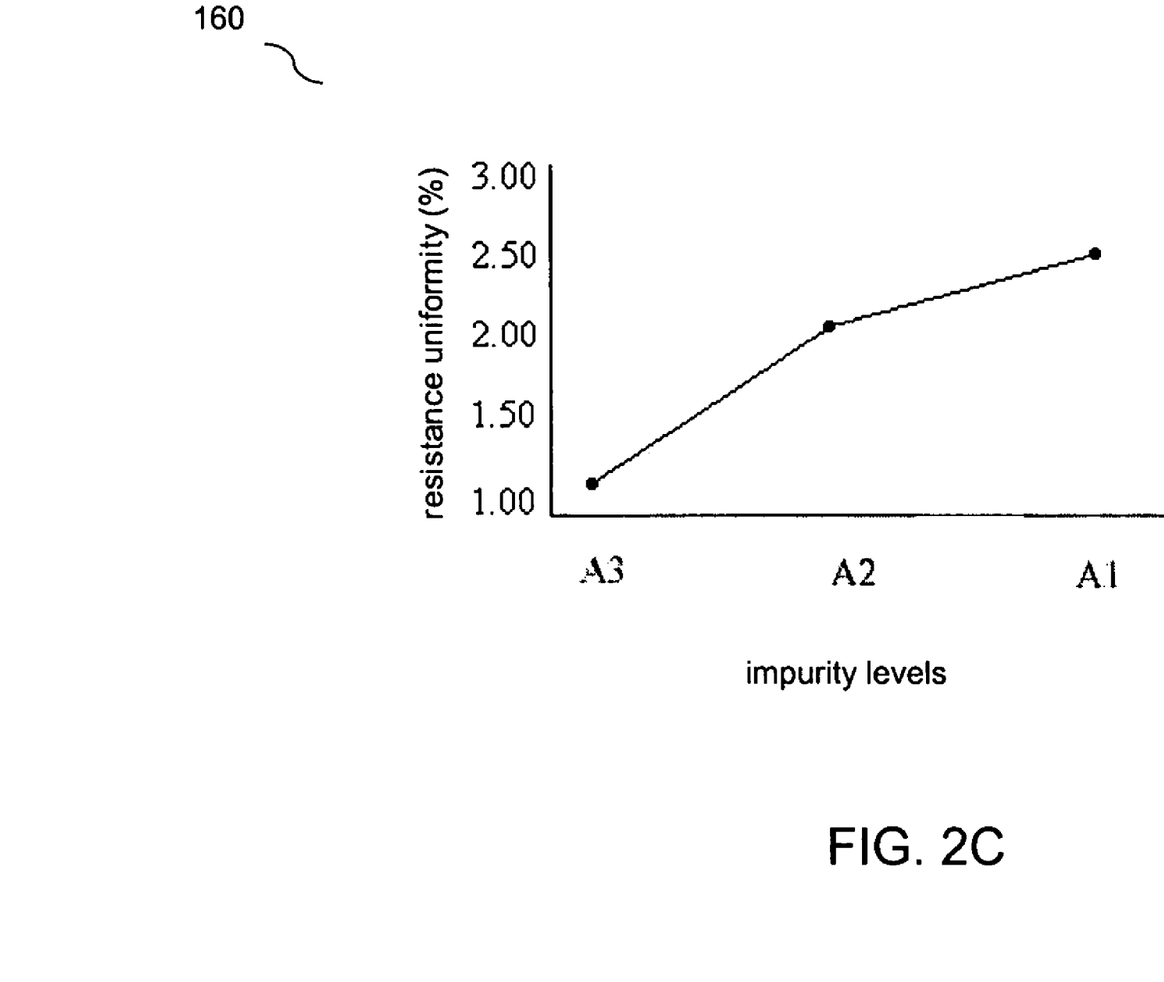

FIGS. 2A-2C present three graphs 120, 140 and 160. The graph 120 shows experimental results of characteristics of copper based structures, such as copper interconnections, formed in the ECP process using various chemical solutions. The chemical solutions are added with various additives for purposes of, for example, acceleration, suppression and leveling. The graph 140 shows the resistivities of copper based structures formed in the ECP process using additives of various impurity density levels. Graph 160 shows the resistance uniformity of copper based structures in the ECP process using-additives of various impurity density levels. The additives include a high impurity polymer additive A1 having densities of oxygen, carbon and chloride higher than $10^{19}$ atoms/cc; a medium impurity polymer additive A2 having densities of carbon and oxygen ranging from $10^{18}$ atoms/cc to $10^{19}$ atoms/cc and a density of chloride ranging from $10^{17}$ atoms/cc to $10^{19}$ atoms/cc; and a low impurity polymer additive A3 having densities of carbon and oxygen lower than $10^{18}$ atoms/cc, and a density of chloride lower $10^{17}$ atoms/cc. The experimental results will show that the additive with a lower impurity density level tends to provide a copper based structure with lower stress and resistivity. This, in turn, reduces the chance of crack development in the copper based structure, due to an undesired high stress.

With reference to FIG. 2A, the copper based structure formed by using the high impurity polymer additive A1 clearly has a higher stress level than that formed by using the medium impurity polymer additive A2, and a much higher stress level than that formed by using the low impurity polymer additive A3. The graph 120 shows that, by replacing conventional high impurity polymer additives with low impurity polymer additives in the ECP process, the internal stress of the copper based structure may be lessened. By lessening the stress applied onto the copper based structure, its probabilities of cracking can be reduced or even eliminated.

Changing the impurity density levels of the additives can affect attributes other than stress. In graph 140, the high impurity polymer additive A1 appeared to create a higher resistivity for the copper based structure than those for the medium impurity polymer additive A2 and the low impurity polymer additive A3. As a desirable result, the low impurity polymer additive A3 provides the copper based structure with the least resistivity. The experiment also shows that the resistivities of copper based structures range from 1.90 to 2.00 ohms. This range is slightly higher than the resistivity of pure copper. This slight difference is mainly caused by the small amount of other materials added to the copper during the ECP process.

The graph 160 shows the difference of resistance uniformities for the copper based structures formed in the ECP process using additives of various impurity levels. Once again, the experiment shows the high impurity polymer additive A1 creates a less uniform resistance for the copper based structure, while the low impurity polymer additive A3 creates a much better resistance uniformity. The lower impurity polymer additive like A3 gives rise to more preferable practical applications.

Conventionally, the additives are composed of polymer with impurities. The commercially available additives usually have an impurity density exceeding $10^{19}$ atoms/cc. This is too high an impurity density. The copper based structure formed by using such additives always have undesirably high stress and poor resistivity.

In this embodiment, the proposed additive is composed of polymer with one or more types of impurities. Each type of the impurities has an impurity density lower than $10^{19}$ atoms/cc. In a preferred embodiment, the types of impurities include, bout not limited to, carbon, oxygen and chlorine atoms. The carbon atoms have a density of about $10^{18}$ atoms/cc, the oxygen atoms have a density of about $10^{18}$ atoms/cc, and the chlorine atoms have a density of about $10^{17}$ atoms/cc, with respect to the polymer. Such additives are able to provide copper based structures with better characteristics of stress and resistivity, as opposed to those formed by using conventional additives.

Figure 3:
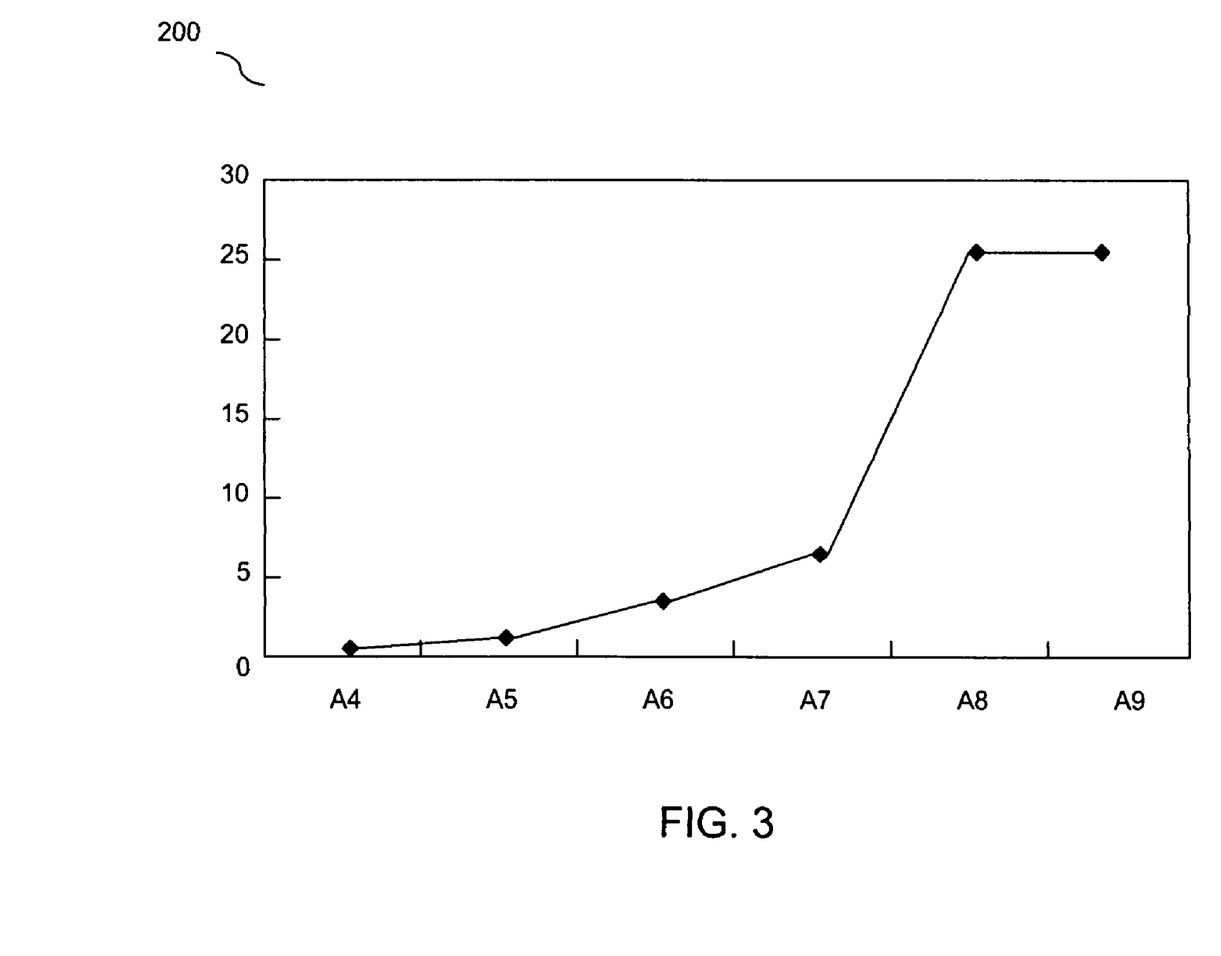
FIG. 3 illustrates a graph showing additives of various charge densities, in accordance with another embodiment of the present invention.

FIG. 3 illustrates a graph 200 showing a curve comparing the charge densities of various polymer additives. In order for the low impurity polymer additive to produce desirable results, it is also important for the additive to have a proper (medium) charge density. A high charge density can slow down gap filling, and a low charge density results in a copper based structure of poor leveling power.

The graph 200 presents a comparison curve of charge densities for six different additives: A4, A5, A6, A7, A8 and A9. These additives are composed of polymer that contains one or more compositions selected from an aromatic amine function group. In this embodiment, the polymer can be expressed as $(CH_2-CH_2-NH)n$, where n is a number between 10 and $10^5$. Alternatively, the polymer can also be expressed as the following structural formula:

Based on the structural formula, the addictives A4, A5, A6, A7, A8 and A9 have the following attributes:

| Additives | Composition (wt %) | | Molecular Mass | Charge Density (meq/g) |
|---|---|---|---|---|
| | X | Y | | |
| A4 | 40 | 10 | 700K | 0.5 |
| A5 | 80 | 20 | 1000K | 1.09 |
| A6 | 55 | 45 | 400K | 3 |
| A7 | 5 | 95 | 40K | 6.1 |
| A8 | | | 150K | 25 |
| A9 | | | 100K | 25 |

The charge densities of additives A4 and A5 are lower than about 1 meq/g. This adversely affects the leveling power of the copper based structures formed by using such additives. The additives A8 and A9 have charge densities higher than about 25 meq/g. This adversely affects the gap-filling ability of the copper based structures formed by using such additives. The charge densities of additives A6 and A7 are 3 and 6.1, respectively, which properly provide the copper based structures with desirable gap-filling ability and leveling power. In this embodiment, the charge densities of additives are deemed proper, if they fall between 3 and 10 meq/g.

Figure 4:
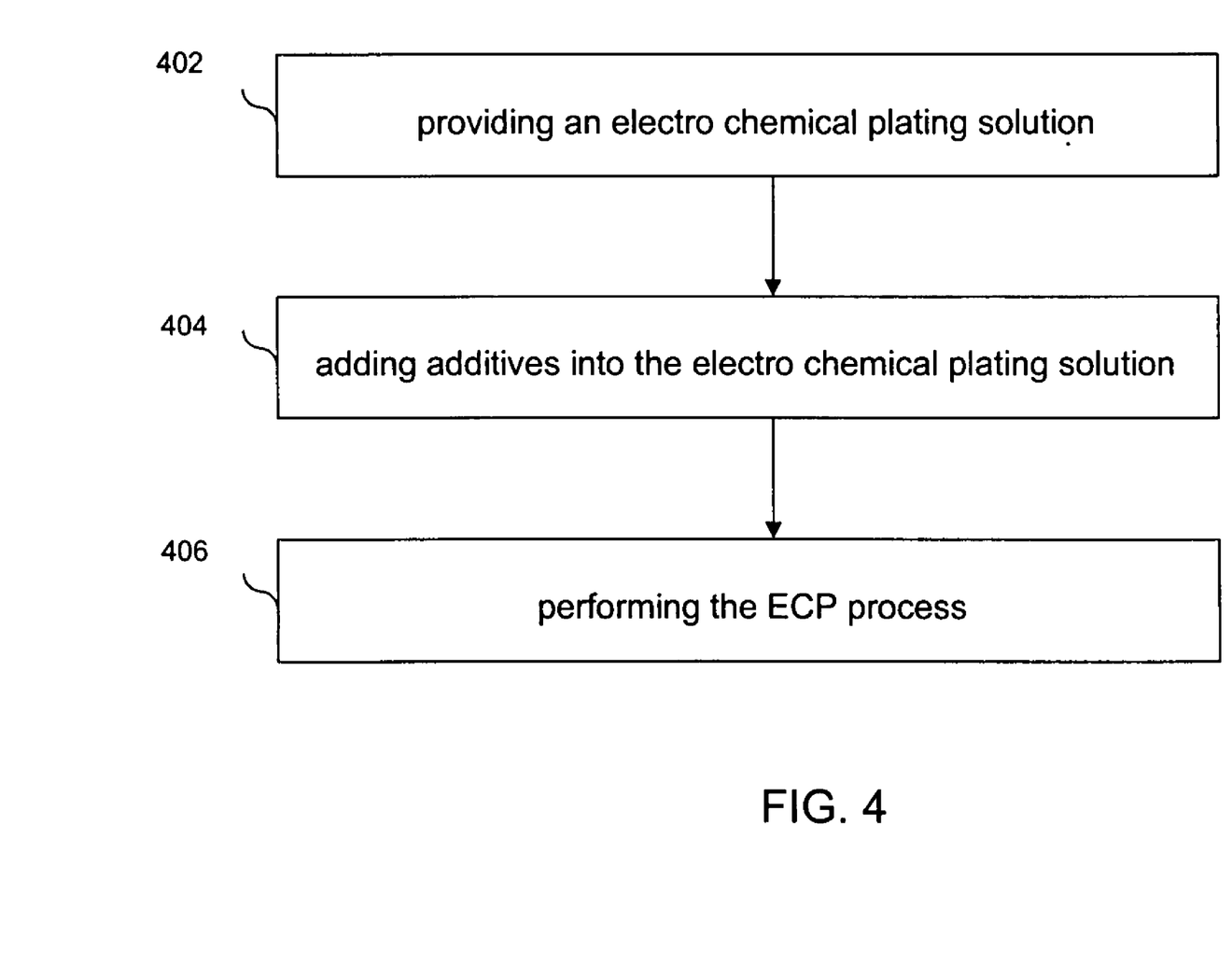
FIG. 4 illustrates a process flow of the ECP process, in accordance with another embodiment of the present invention.

FIG. 4 illustrates a process flow of the ECP process that uses the additives prepared according to the above embodiments of the present invention. In step 402, an electro chemical plating solution, such as a $CuSO_4$ solution, is provided. While the quantity of the electro chemical plating solution depends on the type of commercial tools used in the ECP process, it usually varies from 10 to 200 liters. In step 403, the additives are added into the electro chemical plating solution for purposes, such as acceleration, suppression and leveling. The addictives are of low impurity and medium charge densities, as described above. In step 406, the ECP process is performed by using the electro chemical plating solution added with the additives for forming the copper based structures. As discussed above, the stress, resistivity, leveling power, and gap-filling ability of the copper based structures are, thereby, improved.

The copper based structure formed by the proposed ECP process has a reduced internal stress. A one-um-wide specimen of the copper based structure examined under a secondary ion mass spectroscopy (SIMS) of a scanning depth under 0.8 um shows that the specimen includes one or more types of atoms, such as carbon, chloride, oxygen, or sulfur. Each type of the atoms has a density no greater than $10^{19}$ atoms/cc. Such low atom density helps to improve the characteristics of the copper based structure in semiconductor manufacturing processes.

The above invention provides many different embodiments or examples for implementing low impurity polymer as ECP additives to strengthen the leveling effect and lowering the stress impact applied on the copper film. Specific examples of components and processes are described to help clarify the invention. These are, of course, merely examples and are not intended to limit the invention from that described in the claims.

Also provided is a method for preparing a chemical solution for an electro chemical plating process. An electro chemical plating process utilizes an electro chemical plating solution to plate metal according to various, known methods. The inventive method includes providing an electro chemical plating solution for plating a metal and adding an additive in the electro chemical plating solution, wherein the additive essentially consists of a polymer with one or more kinds of impurities, wherein each kind of the impurities has a density, with respect to the polymer, lower than $10^{19}$ atoms/cc. The additive may include a charge density between about 3 and 25 meq/g. The polymer may contain a nitrogen containing compound or an aromatic amine functional group and may be expressed as (CH2—CH2—NH)n where n is a number between 10 and $10^5$. In one embodiment, the polymer may contain an aromatic amine functional group with a structural formula displayed as X and Y represent relative percentages by weight, in the polymer.

Although illustrative embodiments of the invention have been shown and described, other modifications, changes and substitutions are intended in the foregoing invention. Accordingly, it is appropriate that the appended claims be construed broadly and in a manner consistent with the scope of the invention, as set forth in the following claims.

What is claimed is:

1. A chemical solution for an electro chemical copper plating process, comprising:
   an electro chemical copper plating solution; and
   an additive, added in the electro chemical copper plating solution, comprising a polymer with one or more impurities, wherein each of the impurities has a density, with respect to the polymer, lower than $10^{19}$ atoms/cc,
   wherein the polymer contains a composition including an aromatic amine functional group and the polymer has a structural formula displayed as wherein X and Y represent relative percentages by weight, in the polymer.

2. The chemical solution of claim 1 wherein the polymer is substantially composed of 55% X and 45% Y, in terms of weight.

3. The chemical solution of claim 2 wherein the polymer has a charge density of about 3 meq/g.

4. The chemical solution of claim 1 wherein the polymer is substantially composed of 5% X and 95% Y, in terms of weight.

5. The chemical solution of claim 4 wherein the polymer has a charge density of about 6.1 meq/g.

6. The chemical solution of claim 1 wherein the impurities comprise carbon atoms of a density about $10^{18}$ atoms/cc, with respect to the polymer.

7. The chemical solution of claim 1 wherein the impurities comprise oxygen atoms of a density about $10^{18}$ atoms/cc, with respect to the polymer.

8. The chemical solution of claim 1 wherein the impurities comprise chloride atoms of a density about $10^{17}$ atoms/cc, with respect to the polymer.

9. A method for preparing a chemical solution for an electro chemical copper plating process, comprising:
   providing an electro chemical copper plating solution; and
   adding an additive in the electro chemical copper plating solution, wherein the additive comprises a polymer with one or more impurities, wherein each of the impurities has a density, with respect to the polymer, lower than $10^{19}$ atoms/cc,
   wherein the polymer contains an aromatic amine functional group, wherein the polymer has a structural formula displayed as wherein X and Y represent relative percentages by weight, in the polymer.

10. The method of claim 9 wherein the electro chemical copper plating solution is a $CuSO_4$ based solution.

11. The method of claim 9 wherein the additive has a charge density between about 3 and 25 meq/g.

12. The method of claim 9 wherein the impurities comprise carbon atoms of a density about $10^{18}$ atoms/cc, with respect to the polymer.

13. The method of claim 9 wherein the impurities comprise oxygen atoms of a density about $10^{18}$ atoms/cc, with respect to the polymer.

14. The method of claim 9 wherein the impurities comprise chloride atoms of a density about $10^{17}$ atoms/cc, with respect to the polymer.

15. The method of claim 9 wherein the polymer is substantially composed of 55% X and 45% Y, in terms of weight.

16. The method of claim 15 wherein the polymer has a charge density of about 3 meq/g.

17. The method of claim 9 wherein the polymer is substantially composed of 5% X and 95% Y, in terms of weight.

18. The method of claim 17 wherein the polymer has a charge density of about 6.1 meq/g.

* * * * *